United States Patent [19]

Pressler et al.

[11] Patent Number: 5,550,713
[45] Date of Patent: Aug. 27, 1996

[54] ELECTROMAGNETIC SHIELDING ASSEMBLY FOR PRINTED CIRCUIT BOARD

[75] Inventors: Stephen M. Pressler, Uniontown; James J. Friedmann, Canton; Donald I. Sloan, Stow, all of Ohio

[73] Assignee: Aironet Wireless Communications, Inc., Fairlawn, Ohio

[21] Appl. No.: 524,248

[22] Filed: Sep. 6, 1995

[51] Int. Cl.⁶ .................................................. H05K 9/00
[52] U.S. Cl. ....................... 361/818; 361/796; 361/816; 174/35 R
[58] Field of Search .................................. 361/729, 728, 361/752, 756, 796, 800, 802, 816, 818, 815, 799; 257/659, 660; 439/108, 109, 297, 271, 272, 275, 278, 279, 604, 736, 587; 174/35 R, 65 R; 455/300; 333/246, 247

[56] References Cited

U.S. PATENT DOCUMENTS 5,107,404  4/1992  Tam ...................................... 361/424
5,247,424  9/1993  Harris et al. .......................... 361/704
5,280,412  1/1994  Podell et al. .......................... 361/710

Primary Examiner—Leo P. Picard
Assistant Examiner—Y. Whang
Attorney, Agent, or Firm—Watts, Hoffmann, Fisher & Heinke

[57] ABSTRACT

A shielding assembly for a PC board having ground trace segments on a surface of the board is disclosed. The shielding assembly includes a cover, shielding assembly, a sealing gasket and a fastener. The cover includes an integrally molded base portion and a fencing portion extending outwardly from a surface of the base portion. The fencing includes peripheral edges configured to overlie the ground trace segments. The sealing gasket is disposed between the fencing and the ground trace segments. The fastener mechanically couples the cover to the PC board surface.

15 Claims, 4 Drawing Sheets

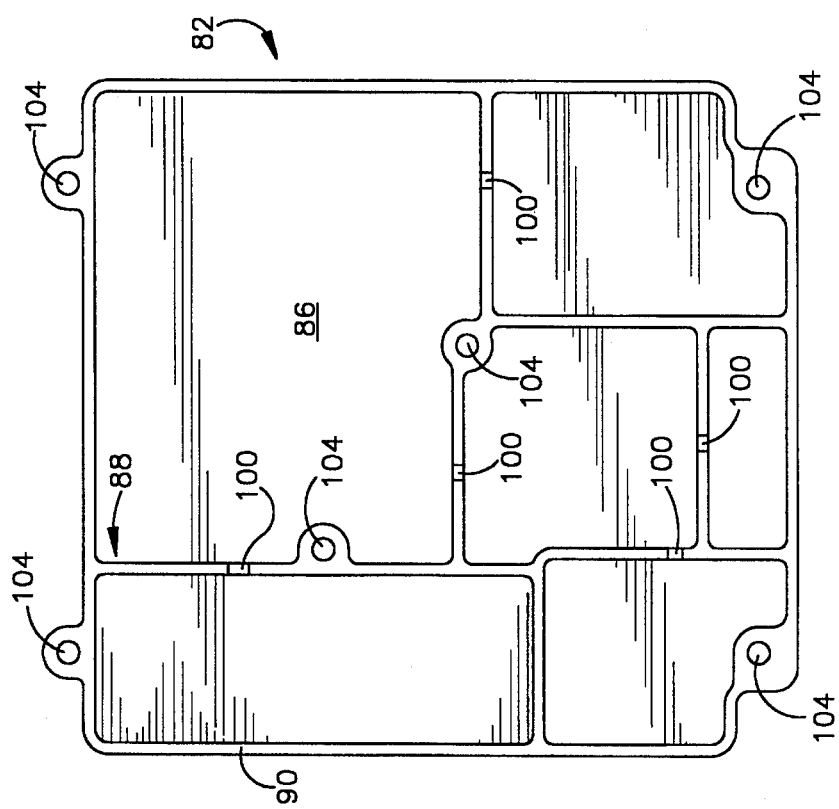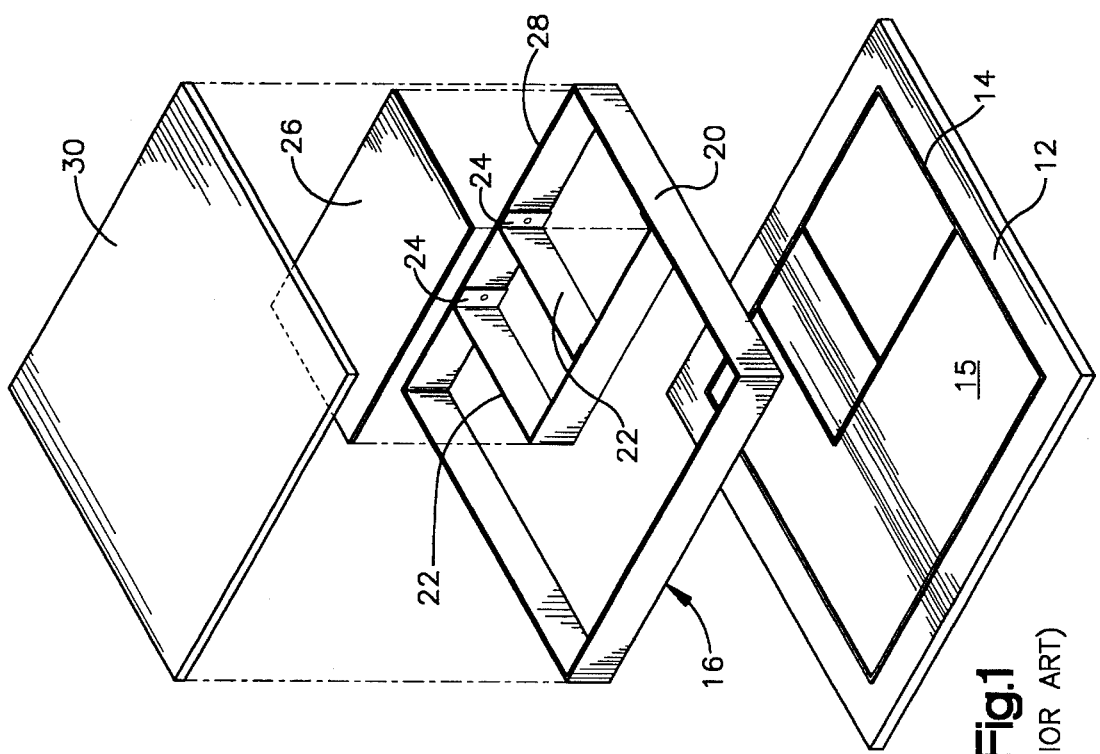

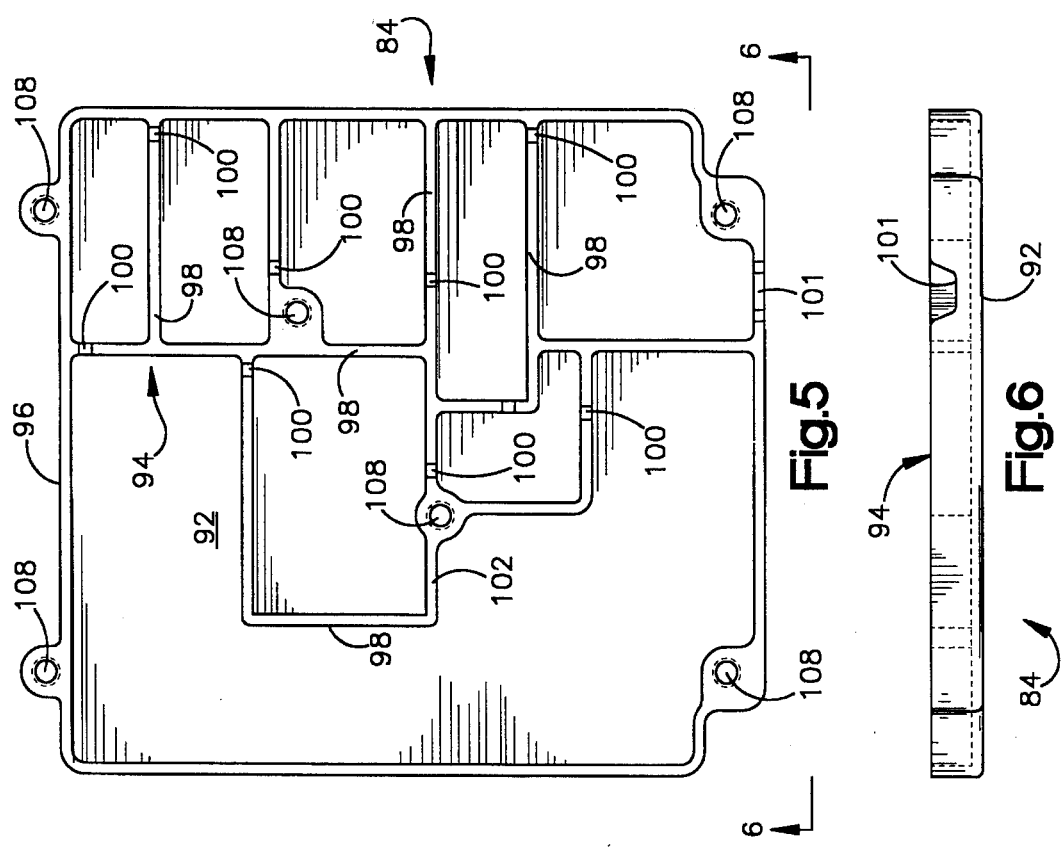
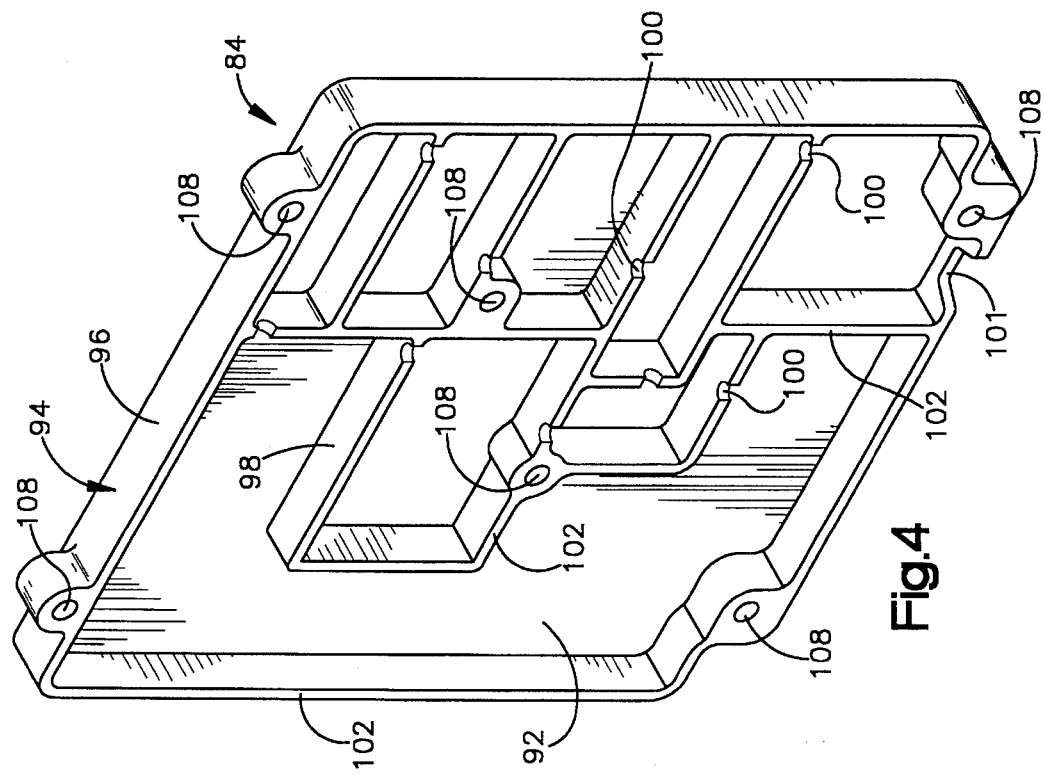

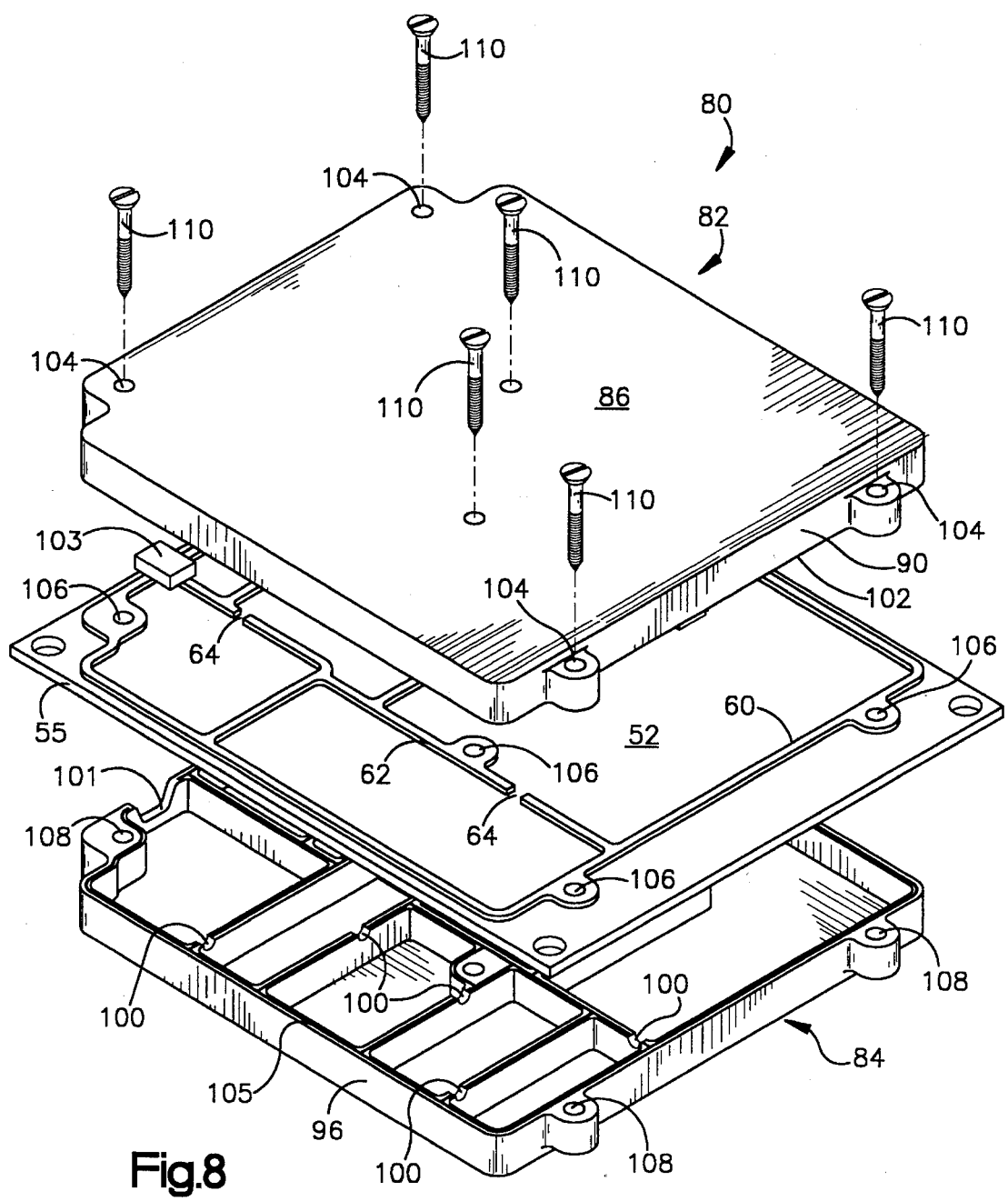

ELECTROMAGNETIC SHIELDING ASSEMBLY FOR PRINTED CIRCUIT BOARD

FIELD OF THE INVENTION

This invention relates to an electromagnetic shielding assembly and, more particularly, to an electromagnetic shielding assembly for a printed circuit board.

BACKGROUND OF THE INVENTION

Printed circuit boards (PC boards) are widely used in electronic devices. Electronic circuitry associated with these devices is typically mounted on one or more PC boards. A PC board comprises a generally planar insulating base defining opposite surfaces on which a pattern of conductive traces is printed. The conductive traces are formed by etching, plating or stamping. The traces connect electronic components mounted on a surface or side of the insulating base.

To achieve a greater density of circuitry and better avoid internal interference on a PC board, electronic components may be mounted on both surfaces of the board. For example, PC boards used in radio communications devices may advantageously have radio frequency (RF) circuitry mounted on one surface of the board and digital processing circuitry mounted on the opposite surface. Conductive traces are printed on each surface of the board to provide necessary electrical connections for the mounted electronic components. Further, connections which traverse through the PC board are provided to permit communications of signals between components on opposite surfaces of the board.

In complex electronic devices, circuitry disposed on either side of a PC board may be comprised of several functional circuits, i.e. voltage regulation circuitry, signal amplification circuitry, frequency modulation circuitry, etc. These functional circuits are often grouped together and partitioned from other areas on the PC board by means of a printed ground traces. The ground traces provide a convenient connection to ground for nearby circuitry. If a connection between circuits in different sections of the board need to be made on a surface of the PC board, a suitably positioned gap is provided in the ground trace separating the circuits. These gaps allow one or more conductive traces to pass through the ground traces and connect the respective sections. One or more grounding plates are sandwiched between insulating layers of the base. Connections between the ground traces and the grounding plates are provided by vias, which are conductively plated throughholes extending between the ground traces and the grounding plates.

Operation of electronic circuitry having a time varying signal generates electromagnetic radiation and results in electromagnetic fields emanating from the circuitry. An electromagnetic field generated by circuitry in one section of the PC board may be picked up by and interfere with the operation of circuitry in other sections of the board (or, if the electromagnetic field is strong enough, circuitry on adjacent PC boards). Undesirable electromagnetic fields generated by energized circuitry are commonly referred to as electromagnetic interference (EMI).

In the case of radio communications equipment, unwanted RF noise or leakage emitted by equipment circuitry may escape from the equipment and interfere with the operation of other nearby electronic devices. FCC regulations limit the quantity of RF leakage which is permitted to escape into the environment from various classes of radio communications equipment.

One proposal advanced to address the aforementioned EMI and RF noise problems is illustrated in FIG. 1. As illustrated, this proposal utilizes a metal fence and lid assembly, shown generally at 10, which overlies and is secured to a PC board 12. The PC board 12 includes a series of ground traces 14 on a surface 15 of the board. The assembly 10 is comprised of an upright fence 16 which is constructed from thin strips of metal. The metal strips are bent and spot welded to adjacent metal strips to form a shape congruent with the ground traces 14. The upright fence 16 is comprised of an outer fence 20 and inner fence segments 22. The outer fence 20 is formed by bending one or more metal strips into a rectangular-shaped fence corresponding to the shape of an outer periphery of the ground traces 14 and spot welding overlapping ends of the strip together. The inner fence segments 22 have short right angled portions 24 at each end. The right angle portions 24 are spot welded to the outer fence 20 or to another inner fence segment 22. The inner fence segments 22 are sized and positioned to congruently overlie the ground traces 14 on an interior portion of the PC board.

Following assembly of the upright fence 16, the fence is positioned on the PC board 12 so as to overlie the ground traces 14. The fence 16 is soldered to the traces 14. Subsequently an inner lid 26 is soldered to a top edge 28 of the fence 16. The inner lid 26 and the fence 16 reduce EMI between circuitry disposed on different sections of the PC board 12.

Finally, a flat metal outer lid 30 is positioned on top of the entire upright fence 16. The outer lid 30 is soldered to the upright fence 16 at four corners of the outer fence 20. The lid 30 and the outer fence 20 reduce RF leakage from the energized circuitry on the PC board. Metal components are used due their ability to contain electromagnetic radiation.

Unfortunately, the aforementioned proposal has numerous disadvantages. For example, the assembly of the upright fence 16 includes spot welding strips of metal together and often results in uneven fence heights. Thus, when the flat inner and outer lids 26, 30 are secured to the fence, there may be gaps between the lids and the fence permitting electromagnetic interference between circuits and/or RF signal leakage into the environment. Additionally, the process of soldering the upright fence 16 to the ground traces 14 can also be problematic. The ground traces 14 are typically only on the order of 0.05 inches wide, thus, it is easy to accidentally ground out adjacent conductive traces and/or components while soldering the upright fence 16 to the ground traces 14. Once constructed, repair or modification of the circuitry on the PC board 12 is difficult to accomplish because of the upright fence 16 and lids 26, 30 being soldered. Additionally, assembly of the fence and lid assembly 10 is painstaking and constitutes a significant cost in time and money which increases the price of the device within which the PC board is to be utilized.

Another proposal for controlling RF leakage involves inserting the PC board into a plastic bag coated on both sides with a thin metal layer. The opening of the plastic bag is sealed using tape or another fastening means. This method of controlling RF leakage has proven only marginally efficient. Additionally, this method does not remedy the problem of electromagnetic interference between circuits located on different sections of the board. Therefore, interior fences must be constructed and soldered to the ground traces to isolate circuit sections. Thus, this proposal does not provide a complete solution to the electromagnetic interference and RF signal leakage problems.

SUMMARY OF THE INVENTION

An object of the present invention is to reduce EMI between circuits disposed on different section of a PC board by overlying each circuit with an EMI blocking structure.

Another object of the present invention is to reduce RF leakage from circuitry disposed on a PC board by overlying the circuitry with an RF blocking structure.

Still another object of the present invention is to provide an EMI and RF leakage blocking structure that does not require soldering.

Another object of the present invention is to provide an easily alignable and removable EMI and RF leakage blocking structure.

Yet another object of the present invention is to provide an efficient and cost effective method of minimizing EMI and RF leakage from a PC board.

The present invention relates to a shielding assembly for a PC board having ground traces disposed on a surface of the board. The shielding assembly includes an integrally molded or casted PC board cover, a sealing gasket and a fastener. The integrally molded or casted PC board cover is adapted to be secured to the surface of the board and includes a base portion and fencing extending outwardly from a surface of the base portion. The fencing includes an outer fencing segment having a peripheral edge configured to overlie an outermost ground trace segment on the PC board surface when the cover is secured to the board.

The fencing further includes a plurality of interior fencing segments disposed within an area defined by the outer segment. The outer fencing segments are configured to overlie a peripheral ground trace on the PC board. The interior segments of the fencing are configured to overlie ground traces disposed within the outermost ground trace when the cover is secured to the board. The sealing gasket is disposed between the cover and the ground traces. The fastener secures the cover to the PC board. The shielding gasket is preferably comprised of a silicone base impregnated with silver-plated copper.

Advantageously, if the PC board includes circuitry on both sides of the board the shielding assembly includes two mating covers mechanically coupled together with the PC board sandwiched between. Each cover includes fencing configured to overlie ground traced on its respective surface of the PC board.

Additional features of the invention will become apparent and a fuller understanding obtained by reading the following detailed description made in connection with the accompanying drawings.

BRIEF DESCRIPTION OF THE DRAWINGS

FIG. 1 is an exploded perspective view of a known electromagnetic shielding assembly and a PC board which the assembly is mounted to;

FIG. 4 is a perspective view of a bottom integrally molded cover of the present invention and including fencing extending from a base portion, the fencing configured to overlie ground traces on the one side of the PC board;

FIG. 5 is a plan view of the cover of FIG. 4;

FIG. 6 is a side elevation view of the cover of FIG. 4 as seen from a plane indicated by the line 6—6 in FIG. 5;

FIG. 7 is a plan view of a second integrally molded cover of the present invention, the cover including fencing extending from a base portion, the fencing configured to overlie ground traces on the opposite side of the PC board; and FIG. 8 is an exploded perspective view of a shielding assembly of the present invention including the first and second covers and top and bottom lid assembly overlying the PC board of FIG. 2.

DETAILED DESCRIPTION

Figure 3:
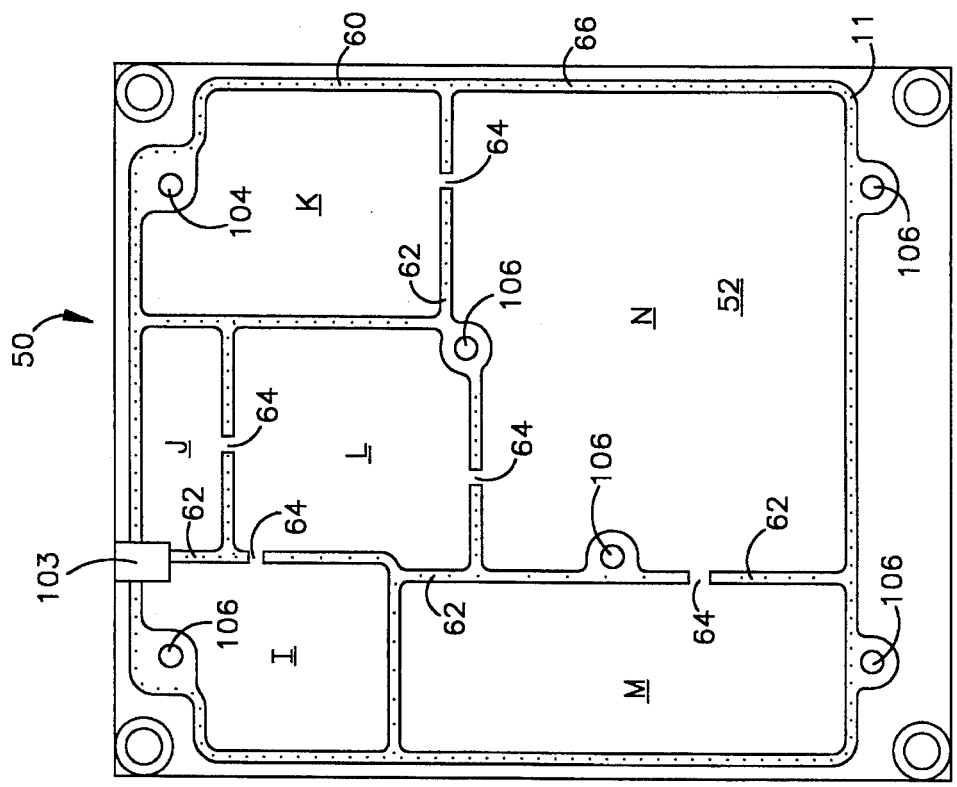
FIG. 3 is a plan view of an opposite side of the PC board of FIG. 2, the side including a plurality of ground traces.
Figure 2:
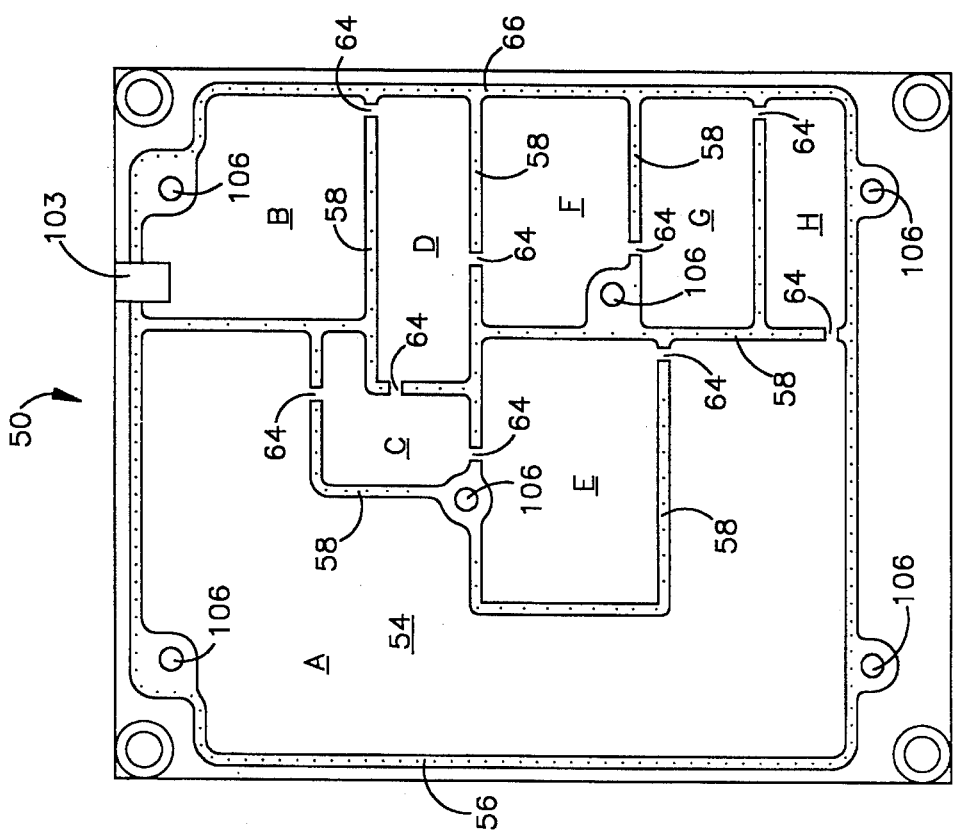
FIG. 2 is a plan view of one side of a PC board, the side including a plurality of ground traces.

Turning to the drawings, FIGS. 2 and 3 schematically illustrate a printed circuit (PC) board 50 in which the circuitry and conductive traces are not shown for ease of depiction. The board 50 includes a top surface 52 (FIG. 3) and a bottom surface 54 (FIG. 2) spaced apart by an intermediate insulating layer 55 (FIG. 8). Circuitry (not shown) is mounted on each surface 52, 54 of the board 50. For example, the top surface 52 (shown in FIG. 3) may have mounted thereon RF circuitry, while the bottom surface 54 (shown in FIG. 2) may have mounted thereon digital circuitry. The circuitry mounted on a surface of the board 50 includes electronic components (not shown) which are electrically coupled by conductive traces (not shown) etched on the surface.

The circuitry disposed on a surface of the board 50 may include a plurality of circuits, each performing a different function. The circuits are positioned on different sections of the surface. For example, the bottom surface 54 of the PC board 50 includes sections labeled A, B, C, D, E, F, G, H. Different functional circuits (not shown) are located in each section of the surface 54. The sections A, B, C, D, E, F, G, H are separated or bounded by ground traces. The bottom surface 54 includes an outermost peripheral ground trace 56. Within the outermost ground trace 56 are a plurality of interior ground traces 58 separating the sections A, B, C, D, E, F, G, H. Similarly, the top side 52 of the board 50 includes sections labeled I, J, K, L, M, N, in which different functional circuits (not shown) are located. The sections I, J, K, L, M, N are separated or bounded by ground traces. The top surface 52 includes an outermost ground trace 60. Within the outermost ground trace 60 are a plurality of interior ground traces 62 separating the sections labeled I, J, K, L, M, N.

In order to allow for communication between circuits in two or more sections, there are breaks or discontinuities 64 along the interior ground traces 11 through which conductive traces are routed to connect appropriate circuits. The board 50 includes one or more ground plates (not shown) disposed in the intermediate insulating layer 55 between the top and bottom surfaces 52, 54. The ground traces 56, 58, 60, 62 connect to the ground plates through a plurality of conductive vias 66. The vias 66 are throughbores plated with conductive material which extend vertically from a surface to the grounding plate. Conductive traces connect appropriate leads of electronic circuitry components mounted on a surface to the ground traces to provide necessary grounding connections.

FIGS. 4–8 illustrate a preferred embodiment of a shielding assembly of the present invention, shown generally at 80 (FIG. 8). The shielding assembly 80 is comprised of a top cover 82 and a bottom cover 84. As can best be seen in FIG. 7, the top cover 82 includes a substantially planar base portion 86 from which fencing 88 extends in a direction substantially normal to the base portion. The fencing 88 includes an outer segment 90 which is configured to be congruent with the outermost ground trace 60 of the top surface 52 when the cover 82 is secured to the board 50. The fencing 88 also includes interior segments 91 which are configured to be congruent with the interior ground traces 62 of the top surface 52 when the cover 82 is secured to the board 50. The base portion 86 and the fencing segments 90, 91 respectively are integrally molded forming a one piece cover 82. The interior fencing segments 91 include recesses 100 which are configured to overlie respective discontinuities 64 in the interior ground traces 62. The recesses 100 are necessary to prevent contact with the conductive traces (not shown) extending through the discontinuities 64. The top cover 82 is preferably made of a zinc-aluminum alloy such as zamak #3. The top cover 82 is fabricated using a zinc die cast method well known to those skilled in the art. However, it should be understood that other alloys with similar flow properties may be used. The zinc-aluminum alloy zamak #3 is the preferred material for the top cover 82 because it has good EMI blocking properties. It is also easy to die cast because of its favorable flow properties. Furthermore, the top cover 82 is lightweight, durable and resistant to environmental contaminants.

The bottom cover 84 is constructed similarly to the top cover 82. As can best be seen in FIGS. 4–6, the bottom cover 84 includes a substantially planar base portion 92 (FIG. 6) from which fencing 94 extends. The fencing 94 includes an outer segment 96 which is configured to be congruent with the outer ground trace 56 of the bottom surface 54 of the PC board 50 when the cover 84 is secured to the board 50. The fencing 94 also includes interior segments 98 which are configured to be congruent with the interior ground traces 58 of the bottom surface 54 when the cover 84 is secured to the board 50. As with the top cover 82, the bottom cover base portion 92 and the fencing segments 96, 98 respectively are integrally molded to form a one piece cover. The interior fencing segments 98 includes recesses 100 which overlie respective discontinuities 64 in the interior ground traces 58. The recesses 100 are necessary to prevent interference with the conductive traces (not shown) extending through the discontinuities 64. As with the top cover, the bottom cover 84 is preferably fabricated from the zinc-aluminum alloy zamak #3. The fencing outer segments 90, 96 each include a recessed portion 101 which defines an opening for an antenna connector and any other necessary leads.

In order to provide an effective seal between an upper surface of the fencing segments 90, 91, 96, 98 and their respective ground trace segments 56, 58, 60, 62, upper surfaces 102 of the fencing segments are coated with a sealing material forming a sealing gasket 105 (FIG. 8). The primary purpose of the sealing gasket is to ensure that no unintended voids are left between the fencing segments upper surfaces 103 and the ground trace segments 56, 58, 60, 62 after assembly of the cover 82, 84 to the board 50. The preferred sealing gasket is made of a silicone base impregnated with copper and silver. An appropriate sealing material for forming the sealing gasket is available from Tecknit ® of Cranford, N.J. under the product name "FORM-IN PLACE GASKET".

The sealing gasket 105 is applied as a thin semi-solid, pasty, gelatinous string of sealing material to the upper surfaces 103 of the fencing segments 56, 58, 60, 62. The sealing gasket 105 dries into a malleable, solid material that is resilient and effective in blocking EMI. After drying, the string of sealing material is sandwiched between the upper surfaces 103 and the ground trace segments 56, 58, 60, 62 when the covers 82, 84 are secured to the board 50. The sealing gasket 105 is particularly beneficial in containing high frequency EMI and RF noise generated by the circuitry on the board 50. Additionally, the sealing gasket 105, in combination with the covers 82, 84, helps isolate the board 50 from dust, humidity and other adverse environmental conditions.

The string of sealing material is not applied to the recesses 100 or the recessed portion 101 of the covers 82, 84. The malleable, resilient nature of the sealing material minimizes the problem of sealing material overflowing onto circuitry adjacent the ground traces 56, 58, 60, 62 thereby reducing the chance of shorting out circuitry. Additionally, the malleable nature of the sealing gasket 105 compensates for minor indentations in the board 50, for example, the indentations associated with the vias 66. Advantageously, the sealing gasket material may be applied to the upper surfaces 103 of the fencing segments 56, 58, 60, 62 using a machine controlled by a programmable controller (PC). The PC is programmed to move a material dispensing arm in a predetermined pattern to appropriately apply the sealing material to the upper surfaces 103.

As can best be seen in FIG. 8, assembly of the shielding assembly 80 involves aligning apertures 104 in the top cover 82 with corresponding apertures 106 in the ground traces 56, 58, 60, 62 and the PC board 50. Similarly, apertures 108 in the bottom cover 84 are aligned with the apertures 106.

The top cover 82, the bottom cover 84 and the PC board 50 are mechanically coupled using standard screws 110 which traverse through the aligned apertures. The apertures facilitate proper alignment of the covers 82, 84 with the board 50. The screws are tightened to a torque of 1 inch-pound. When assembled, the shielding assembly 80 overlies and isolates each of the functional circuits disposed in the sections A, B, C, D, E, F, G, of the bottom surface 54 and the sections I, J, K, L, M, N of the top surface 52. This reduces EMI between circuits. The shielding assembly 80 also encloses all circuitry on the PC board thereby reducing RF leakage into the environment.

Although the invention has been described in its preferred form with a certain degree of particularity, it is understood that the present disclosure of the preferred form has been made only by way of example and that numerous changes in the details of construction, operation and combination and arrangement of parts may be resorted to without departing from the spirit and the scope of the invention.

We claim:

1. An electromagnetic shielding assembly for a PC board having ground trace segments disposed on a surface of the board, the shielding assembly comprising:
   a) a PC board cover adapted to be secured to the board surface, the cover including an integral base portion and fencing extending outwardly from a surface of the base portion, the fencing includes:
      i) an outer fencing segment having a peripheral edge configured to overlie an outermost ground trace segment on the PC board surface when the cover is secured to the board surface; and
      ii) a plurality of interior fencing segments disposed within the outer fencing segment, each of the plurality of interior segments having a peripheral edge configured to overlie a different ground trace segment disposed within the outermost ground trace segment on the board surface;
   b) a fastener to secure the cover to the PC board surface; and
   c) a sealing gasket disposed between said ground trace segments and said cover to seal the peripheral edges of the outer and interior fencing segments to corresponding ground trace segments when the cover is secured to the PC board surface.

2. The shielding assembly of claim 1 wherein the sealing gasket is comprised of silicone base impregnated with silver-plated copper.

3. The shielding assembly of claim 1 wherein the cover is die cast from a zinc-aluminum alloy.

4. The shielding assembly of claim 3 wherein the zinc-aluminum alloy is zamak #3.

5. The shielding assembly of claim 1 wherein the fastener is comprised of a plurality of screws extending through aligned apertures in the cover and the PC board.

6. The shielding assembly of claim 1 wherein the ground trace segments include gaps and the plurality of interior fencing segments include recesses in corresponding sections of the peripheral edges overlying the gaps.

7. An EMI shielding assembly for a PC board having ground trace segments disposed on opposite sides of the board, the shielding assembly comprising:

(a) a first integrally molded PC board cover adapted to be secured to a first side of the board, the first cover including a base portion and a fencing portion extending from the base portion, the fencing portion configured to overlie the ground trace segments on the first side of the board when the first cover is secured to the first side of the board;

(b) a second integrally molded PC board cover adapted to be secured to a second side of the board, the second cover including a base portion and a fencing portion extending from the base portion, the fencing portion configured to overlie the ground trace segments when the second cover is secured to the second side of the board;

(c) a fastener to secure the first and second covers to the first and second sides of the board; and (d) a sealing gasket disposed between the fencing portions of the first and second covers and the ground trace segments to seal outwardly extending peripheral edges of said fencing portions to corresponding ground trace segments when the covers are secured to the PC board.

8. The shielding assembly of claim 7 wherein the sealing gasket is comprised of silicone base impregnated with silver-plated copper.

9. The shielding assembly of claim 7 wherein each of the first and second covers are die cast from a zinc-aluminum alloy.

10. The shielding assembly of claim 9 wherein the zinc-aluminum alloy is zamak #3.

11. The shielding assembly of claim 7 wherein the fastener is comprised of a plurality of screws extending through aligned apertures in the first and second covers and the PC board.

12. The shielding assembly of claim 7 wherein the ground trace segments include gaps and the fencing portion includes recesses in sections overlying the gaps.

13. A method of assembling an electromagnetic shield assembly for a PC board having ground trace segments disposed on a surface of the board, the steps of the method comprising:

(a) providing a PC board cover including a base portion and a fencing portion extending therefrom, the fencing portion configured to overlie the ground trace segments when the cover is secured to the board;

(b) applying a sealing material to an upper peripheral surface of the fencing portion;

(c) aligning the cover and the board surface such that the fencing portion overlies the ground trace segments; and (d) securing the cover to the board.

14. The method of claim 13 wherein the step of securing the cover to the board includes a substep of inserting a connecting member through aligned apertures in the cover and board.

15. The method of claim 14 wherein the connecting member includes a plurality of screws, the screws being tightened to a torque of substantially 1 inch-pound.

* * * * *